(12) United States Patent
Wu

(10) Patent No.: US 7,579,905 B2
(45) Date of Patent: Aug. 25, 2009

(54) REDUCED JITTER AMPLIFICATION METHODS AND APPARATUSES

(75) Inventor: Zuoguo Wu, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 52 days.

(21) Appl. No.: 11/714,637

(22) Filed: Mar. 5, 2007

(65) Prior Publication Data

US 2008/0218254 A1 Sep. 11, 2008

(51) Int. Cl.
*G06G 7/12* (2006.01)
(52) U.S. Cl. .................. 327/563; 330/258
(58) Field of Classification Search .......... 327/563; 330/258
See application file for complete search history.

(56) References Cited

U.S. PATENT DOCUMENTS 6,556,081 B2 * 4/2003 Muza ........................ 330/253
6,914,455 B2 * 7/2005 Yoshida et al. ............... 327/65
7,129,782 B2 * 10/2006 Lebedev et al. ............ 330/258
7,312,658 B2 * 12/2007 Gatti et al. ................. 330/253

* cited by examiner

*Primary Examiner*—Kenneth B. Wells
(74) *Attorney, Agent, or Firm*—Schubert Osterrieder & Nickelson PLLC; Garland Charpiot

(57) ABSTRACT

Apparatuses, circuits, and methods to amplify signals with reduced jitter are disclosed. Embodiments generally comprise amplifiers coupled with apparatuses that adjust peak frequencies of the amplifiers to reduce jitter. In many system and apparatus embodiments, the frequency gain boosters receive one or more feedback signals derived from input signals applied to the amplifiers. The frequency gain boosters generally respond to the feedback signals by manipulating or controlling active loads coupled to the amplifiers. In controlling the active loads, the frequency gain boosters generally cause the active loads to peak at frequencies at or near the input signals, the result being attenuated jitter in an output signal of the amplifier.

14 Claims, 4 Drawing Sheets

REDUCED JITTER AMPLIFICATION METHODS AND APPARATUSES

FIELD

The embodiments herein are in the field of electronic devices. More particularly, the embodiments relate to apparatuses, systems, and methods to reduce jitter in amplified signals.

BACKGROUND

Designers of microprocessors and other high performance electronic devices such as communication systems and high frequency application specific integrated circuits (ASICS) are continually improving the throughput and performance of such devices by increasing internal operating frequencies. When internal signal frequencies, such as clock rates and data transmission speeds, are continually increased timing constraints become critical. In many electronic devices noise and non-ideal circuit components cause noise or fluctuations in the frequency and/or timing characteristics of the signals. These fluctuations are often referred to as jitter, a term generally used to describe distortion caused by deviation of a signal from its reference timing position. The deviation may be in the amplitude, time, frequency or phase of the signal. Jitter tends to be extremely problematic in certain types of circuits having periodic or cyclic signals, such as forwarding clock circuits.

Forwarded clocks are used in high speed input-output (I/O) systems such as Fully Buffered Dual In-line Memory Module (FBD, FB-DIMM). The main benefit of a system with a forwarded clock signal is that the system may allow for excellent tracking of low frequency jitter between clock and data signals. In other words, systems and circuits can be designed to reject low frequency common mode jitter. With high speed systems employing forwarded clock signals, an amplifier is often needed to recover the clock signal due to the loss of an interconnect channel. The amplifier may be used to recover the clock signal amplitude before distributing the clock or driving other circuits, such as delay-locked loop (DLL) circuits.

Signal amplifiers, such as forwarding clock amplifiers, often cause jitter amplification problems at higher operating frequencies. For example, if a forwarding clock amplifier receives a clock signal containing jitter, particularly high frequency jitter, the jitter will usually be amplified by the amplifier. This is generally due to the limited bandwidth and low pass nature of the amplifier. A resonant type of clock amplifier, employing inductors and capacitors for resonance and having an operating frequency peaking near the clock frequency, may reduce the problem of jitter amplification. Unfortunately, clock amplifiers employing inductors and capacitors tend to consume relatively large surface areas when implemented within integrated circuits.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

Figure 1:
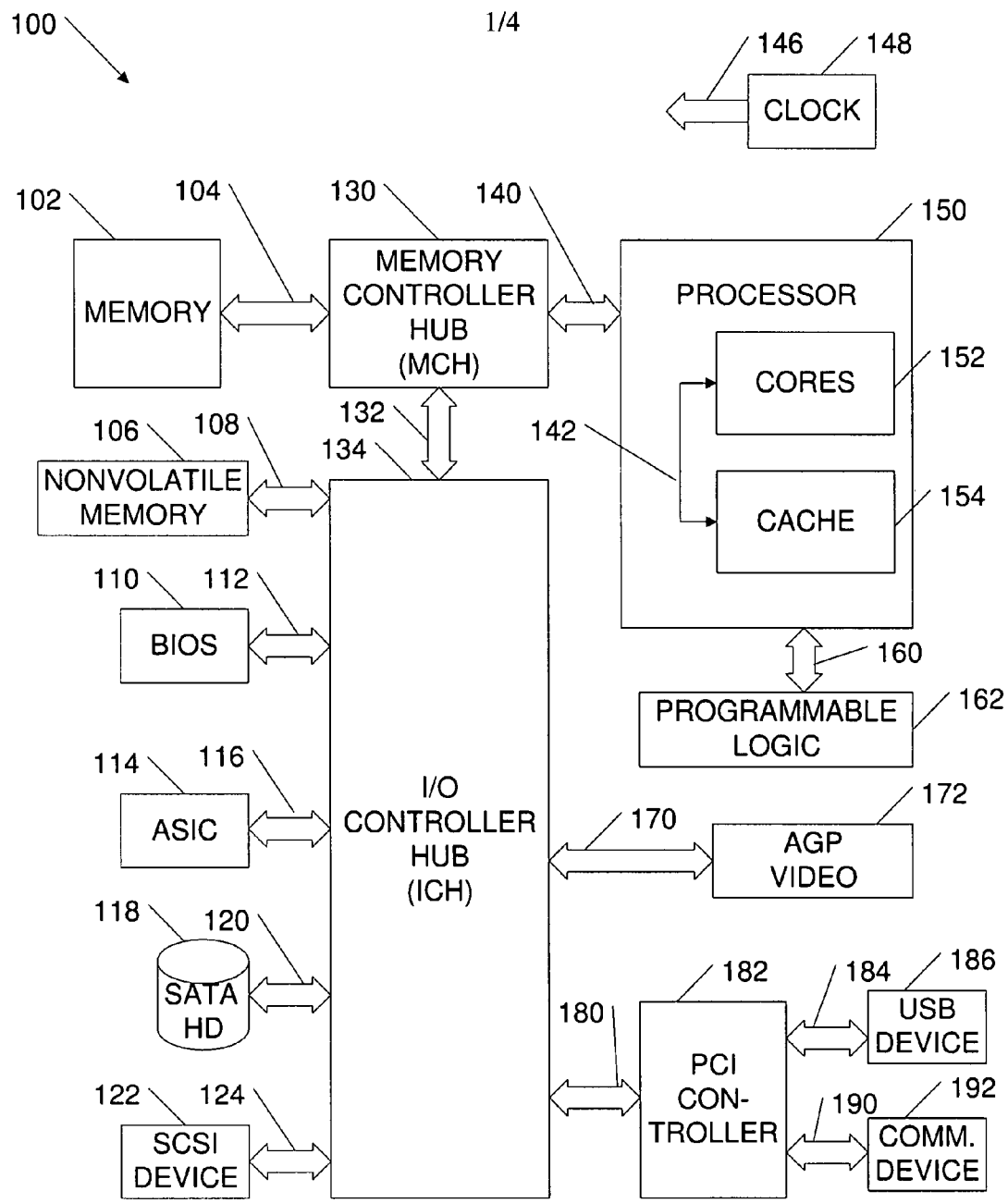
FIG. 1 depicts a system comprising a processor, memory, a memory controller hub, and an I/O controller hub, employing several reduced jitter clock amplifiers.

The following is a detailed description of embodiments depicted in the accompanying drawings. The specification is in such detail as to clearly communicate the embodiments. However, the amount of detail offered is not intended to limit the anticipated variations of embodiments; but on the contrary, the intention is to cover all modifications, equivalents, and alternatives consistent with the spirit and scope of the embodiments as defined by the appended claims.

Generally speaking, apparatuses, circuits, and methods to amplify cyclic signals with reduced jitter are contemplated. Amplifiers of one or more embodiments may be coupled with apparatuses that create a variable peak frequency of the amplifiers to reduce jitter. The frequency peaking effect is generally achieved by boosting the high frequency gain of one or more amplifiers. In many system and apparatus embodiments, a frequency gain booster receives one or more auxiliary signals derived from one or more input signals applied to an amplifier. The frequency gain booster generally responds to the auxiliary signal by manipulating or controlling an active load coupled to the amplifiers. In controlling the active load, the frequency gain booster generally causes the active load to resonate at a resonant frequency and reduce jitter in an output signal of the amplifier. In various embodiments, the peak frequency of the frequency gain booster may be varied.

Some apparatus and system embodiments described herein have a frequency gain booster comprising two auxiliary circuits. Each of the auxiliary circuits may comprise two transistor pairs arranged to receive an auxiliary signal based upon an input signal fed to the amplifier. Based upon receiving the auxiliary signal, the auxiliary amplifier circuit may manipulate or control an active load coupled with the amplifiers, which in turn may affect the operation of the amplifier. By manipulating the active load in response to the input signal the auxiliary circuit may cause the active load to resonate or peak at a particular frequency. Depending on the resonant frequency, which may be altered by changing an auxiliary circuit bias current, the auxiliary circuit may attenuate jitter present in output signal generated by the amplifier.

Method embodiments generally comprise receiving signals with jitter at an input of an amplifier, adjusting an active load coupled to an output of the amplifier, and creating a peak frequency response at the output of the amplifier based upon the signal, and attenuating jitter in the output signal due to the peak frequency response. Some embodiments attenuate jitter for a forwarded clock signal. Various embodiments control an active load by adjusting a bias current of an auxiliary circuit.

While portions of the following detailed discussion describe embodiments to reduce jitter in forwarded clock circuits, persons of ordinary skill in the art will recognize that alternative embodiments may reduce jitter in other types of signaling circuits, such as high speed communication circuits. Additionally, while some portions of the discussion describe reducing jitter in forwarded clock circuits by adjusting peak frequency responses from setting bias currents, other embodiments may adjust peak frequency responses by setting other types of circuit parameters, such as by setting one or more circuit component values.

Turning now to the drawings, FIG. 1 depicts a system 100 with a processor 150, a memory controller hub (MCH) 130, memory 102, and an I/O controller hub (ICH) 134. In some embodiments system 100 may comprise a computer system, such as a notebook, palmtop computer, or personal digital assistant (PDA). In other embodiments system 100 may comprise a different type of computing apparatus, such as a desktop computer.

Processor 150 may have one or more cores 152 coupled with cache 154. For example, processor 150 may have four cores coupled with internal processor cache memory. The cores 152 may couple to cache 154 via an internal high speed interconnect bus 142. Internal high speed interconnect bus 142 may send a high frequency cyclical signal, such as a high speed forwarded clock signal, between cores 152 and cache 154. Processor 150 may receive a clock signal from clock 148 via clock bus 146. Processor 150 may have cores 152 send and receive data to and from cache 154 based on a forwarded clock signal derived from clock 148. For example, the forwarded clock signal may be a clock signal having a frequency four times as great as the frequency of clock 148. In various embodiments, circuits within cores 152 or cache 154 may receive the forwarded clock signal from internal high speed interconnect bus 142 and reduce jitter in the corresponding amplified clock signals.

While internal circuits of processor 150 may reduce jitter via reduced jitter amplification circuits, such as in the case of high speed interconnect bus 142, external circuits coupled to processor 150 may also employ reduced jitter amplification circuits. For example, an amplifier circuit in programmable logic block 162 may reduce jitter of a cyclic signal sent from processor 150 via high speed interface 160. In other words, circuits external to processor 150, yet closely coupled to it, may also attenuate jitter using the methods, circuits, and apparatuses described herein.

Processor 150 may execute operating instructions for programs and applications run by users of system 100, such as instructions of a word processing or a computer aided design (CAD) application. Such software programs and related instructions may be stored in memory 102. Processor 150 may execute the instructions in memory 102 by interacting with MCH 130. The types of memory devices comprising memory 102 may vary in different embodiments. In some embodiments, memory 102 may comprise volatile memory elements, such as two 1-gigabyte (GB) dynamic random access memory (DRAM) sticks. In other embodiments, memory 102 may comprise nonvolatile memory. For example in some embodiments memory 102 may comprise a flash memory module, such as a 4 GB flash memory card.

Processor 150 may be coupled to MCH 130 via a high speed interface bus 140. Similarly, MCH 130 may be coupled with memory 102 via a high speed interface bus 104 and coupled with ICH 134 via a high speed interface bus 132. One or more of high speed interface buses 140, 104, and 132 may send and/or receive forwarded clock signals between processor 150, MCH 130, memory 102, and ICH 134. In such embodiments, amplifiers within processor 150, memory 102, MCH 130, and ICH 134 may attenuate jitter in the forwarded clock signals via peak frequency responses of the amplifiers.

ICH 134 may allow processor 150 to interact with external peripheral devices, such as keyboards, scanners, and data storage devices. Programs and applications being executed by processor 150 may interact with the external peripheral devices. In various embodiments, reduced jitter amplification methods may be employed to increase the speed or performance of ICH 134 while interacting with the external peripheral devices.

System 100 may boot, or initialize, during a power-up process using software algorithms, called firmware, stored within read only memory (ROM) on a motherboard of system 100. In many embodiments, this firmware may be referred to as a basic input/output system (BIOS) 110 program. Included in BIOS 110 may be a Power-On-Self-Test (POST) code, or program, which causes processor 150 to perform a number of predefined tests on system 100 hardware during a boot sequence. BIOS 110 may couple with ICH 134 via a high speed interface bus 112. To improve the overall performance of system 100, such as during the boot sequence, various embodiments may reduce jitter in amplifiers of forwarded clock circuits within ICH 134 or BIOS 110.

Processor 150 may present information to a user via a display device coupled to Advanced Graphics Port (AGP) video card 172. For example, the type of display device may be a cathode-ray tube (CRT) monitor, a liquid crystal display (LCD) screen, or a thin-film transistor flat panel monitor. To increase the rate at which information is conveyed to the user via AGP video card 172, embodiments may reduce jitter in amplifiers of forwarded clock circuits coupled with high speed interface bus 170.

In various embodiments, ICH 134 may allow processor 150 to store and retrieve data from a universal serial bus (USB) device 186 via a Peripheral Component Interconnect (PCI) controller 182. For example, processor 150 may store and retrieve data from USB device 186 while running an application. Processor 150 may also send and receive data via PCI controller 182 and communication device 192. For example, communication device 192 may comprise a network card. In such embodiments, one may improve the performance of system 100 by employing reduced jitter amplifiers in circuits coupled to high speed interface buses 180, 184, and 190. In other words, a designer of system 100 may increase the clock frequency of the forwarded clock signals in one or more of the high speed interface buses 180, 184, and 190 and thereby increase the throughput of PCI controller 182, communication device 192, and USB device 186.

In addition to USB device 186 and communication device 192, ICH 134 may also interact with Advanced Technology Attachment (ATA) devices, such as ATA hard drives, compact disc (CD) drives, and digital versatile disc (DVD) drives. As shown in FIG. 1, system 100 may have a high speed Serial ATA (SATA) bus 120 coupling a SATA drive, such as SATA hard drive 118, to ICH 134. SATA hard drive 118 may be used to store an operating system, device drivers, and application software for system 100. For example, in some embodiments SATA hard drive 118 may store a Linux®, a Unix®, a Macintosh® OS X, a Windows® or some other operating system. To improve the rate of date transfer between SATA hard drive 118 and ICH 134, various embodiments may reduce jitter in amplifiers of forwarded clock circuits within ICH 134 or SATA hard drive 118.

ICH 134 may store and retrieve information in nonvolatile memory 106 via high speed interface bus 108, as well as interact with an application specific integrated circuit (ASIC) 114 via a high speed interface bus 116. For example, nonvolatile memory 106 may comprise flash memory in some embodiments while comprising programmable read-only memory (PROM) or another type of memory in other embodiments. Additionally, ICH 134 may store and retrieve data using a Small Computer Systems Interface (SCSI) device 122 via a high speed interface bus 124. In such embodiments, one may improve the performance of system 100 by employing reduced jitter amplifiers in circuits coupled to high speed interface buses 108, 116, and 124.

As noted above, system 100 may employ clock 148 to generate a global clock signal for various elements of system 100. In various embodiments, circuits within each of the system elements coupled to the respective high speed interface buses may use reduced jitter amplifiers to improve system performance. For example, in addition to or in lieu of high speed interface bus 170, AGP video card 172 may receive a global high frequency forwarded clock signal from clock 148 via clock bus 146 and a reduced jitter amplification circuit.

System 100 may also employ reduced jitter amplification circuits with high speed interface buses to couple with other types of hardware not depicted in FIG. 1, such as a sound card, a scanner, and a printer, as examples. Conversely, in different embodiments, system 100 may not comprise all of the elements used to illustrate the embodiment shown in FIG. 1. For example, some embodiments of system 100 may not comprise SCSI device 122, PCI controller 182, USB 186, communication device 192, and their respective interface buses.

Figure 2:
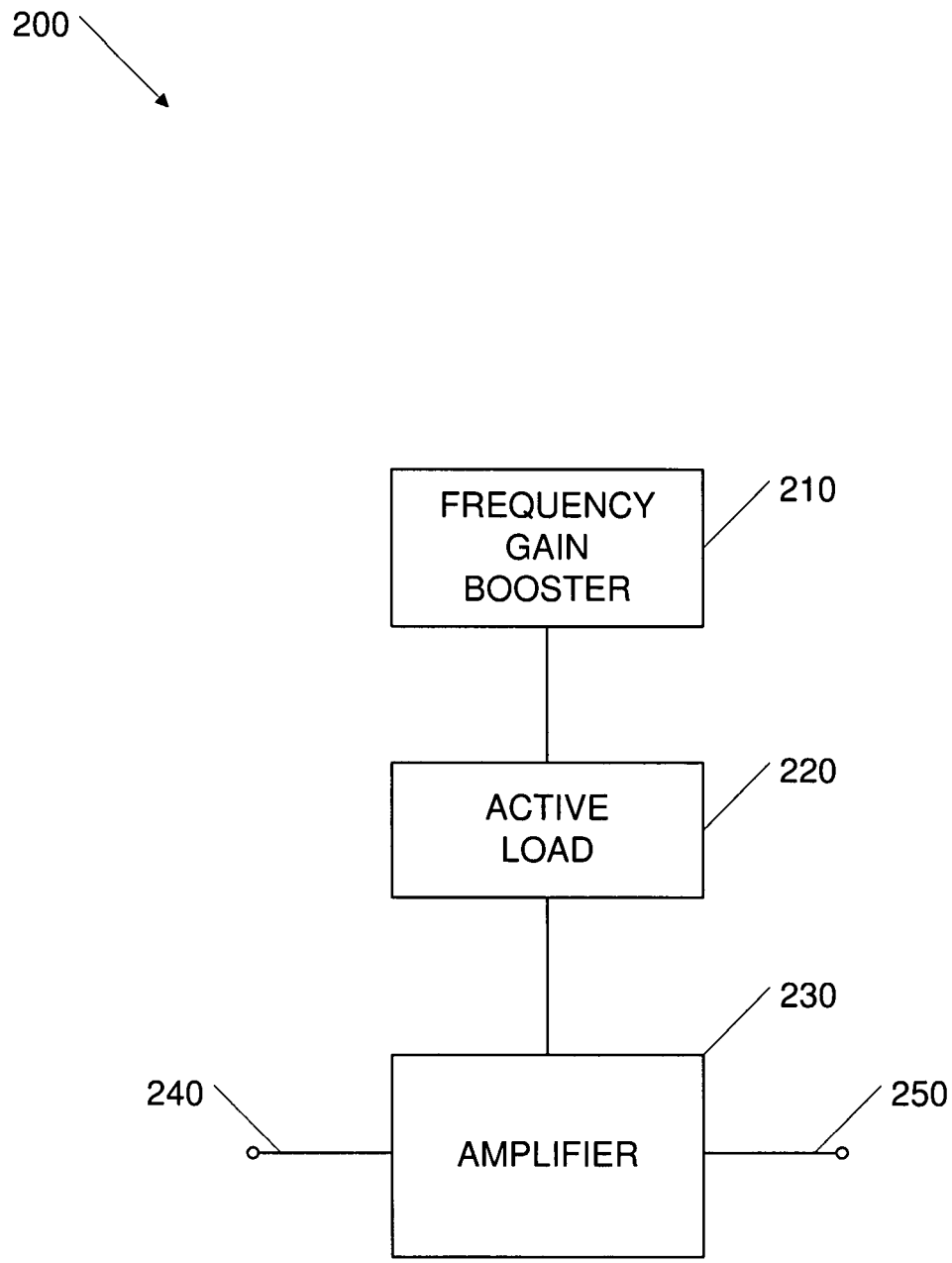
FIG. 2 shows an embodiment of an amplifier circuit, coupled with an active load and a frequency gain booster.

Moving now to FIG. 2, we see an embodiment of jitter reduction amplifier apparatus 200, comprising an amplifier 230 coupled with an active load 220 and a frequency gain booster 210. Amplifier 230 may comprise an amplifier in a high speed I/O system, such as a Fully Buffered Dual In-line Memory Module, in various devices that may need such interfaces, such as microprocessors, chipsets, and memory buffers.

In the embodiment of FIG. 2, amplifier 230 has an input 240 and an output 250. Amplifier 230 may receive a high frequency cyclical input signal at input 240, amplify the signal, and generate an output signal at output 250. In some embodiments, the amplified output signal may be inverted, while in other embodiments it may be non-inverted. Input 240 and output 250 may be referenced to a common system ground or to a local interconnect ground. Additionally, in alternative embodiments, input 240 and output 250 may comprise multiple input and output terminals. For example, amplifier 230 may comprise a differential amplifier wherein input 240 comprises a two-terminal differential input while output 250 comprises a two-terminal differential output.

Since amplifier 230 may be implemented in a high speed interface, as noted above, input 240 may receive an input signal containing jitter. For example, jitter may be induced onto the input signal from a variety of different sources, such as phase-locked loop (PLL) thermal noise or from a power supply. If amplifier 230 receives such an input signal containing jitter, particularly high frequency jitter, amplifier 230 may tend to amplify such jitter and include the amplified jitter component in the output signal produced at output 250. Such amplification may be a result of the limited bandwidth and low pass nature of amplifier 230. While an ideal input signal may have a single frequency, a real signal containing the ideal signal combined with the jitter may actually have a multitude of frequencies spread over the associated frequency spectrum. The width of the spread may generally depend on the jitter frequency. For example, very high frequency jitter may spread out relatively wide over a large frequency spectrum. Jitter amplification effect of amplifier 230 may tend to increase the relative power of spread out frequencies with respect to the desired frequency. In the time domain, the result may be increased timing uncertainty and/or error.

To attenuate the effects of high frequency jitter imposed on the input signal, amplifier 230 may be controlled, or manipulated, to respond in a fashion similar to an inductor-capacitor (LC) tank circuit. An LC tank circuit has a natural band pass response. When amplifier 230 behaves like an LC tank circuit while amplifying the input signal, amplifier 230 will tend to attenuate the frequencies that differ from the resonant frequency of the LC tank circuit. For example, if amplifier 230 receives and amplifies a 4 GHz forwarded clock signal that matches the resonant frequency, amplifier 230 may tend to pass the 4 GHz signal while attenuating the high frequency jitter components above and below the center, or peak, 4 GHz frequency.

To create this peak response of jitter reduction amplifier apparatus 200, active load 220 may be manipulated or controlled in a manner which affects the amount of amplification provided by amplifier 230. In other words, active load 220 may be selectively coupled with amplifier 230 in varying amounts, at different stages in the cycle of the output waveform, such that the overall response of amplifier 230 is dampened. Frequency gain booster 210 may be manipulated, causing active load 220 to interact with amplifier 230 in differing amounts. In other words, frequency gain booster 210 may be manipulated to cause amplifier 230 to provide maximum amplification at different frequencies. For example, frequency gain booster 210 may be set to a first setting and cause active load 220 and amplifier 230 to have a center, or peak, frequency of 4 GHz, yet also be set to a second setting and cause active load 220 and amplifier 230 to have a peak frequency of 5 GHz. When implemented in this fashion, frequency gain booster 210 and active load 220 may mimic or behave similar to an LC tank circuit and tend to attenuate the jitter amplification which would otherwise be present at frequencies other than the peak frequency.

Figure 3:
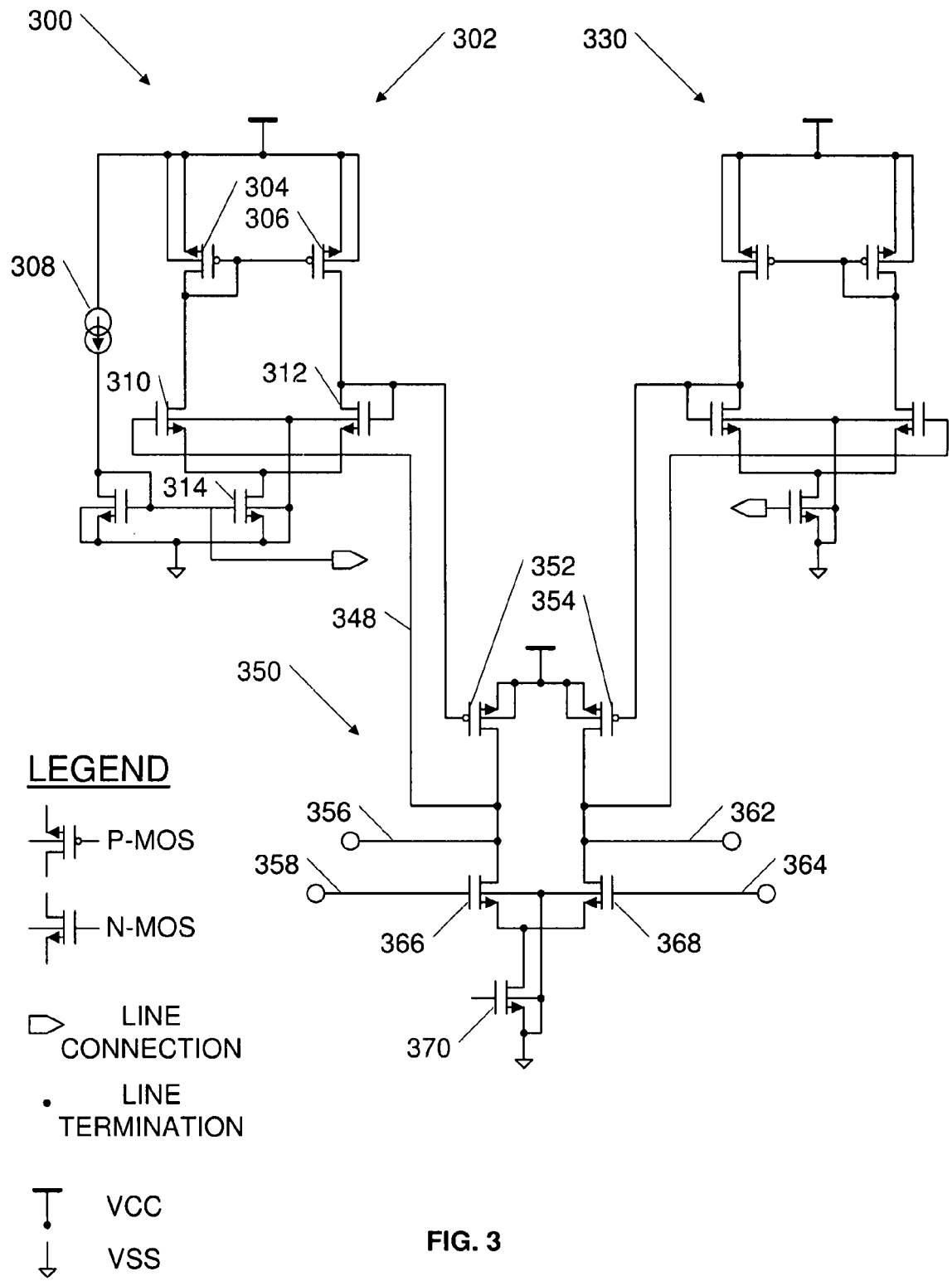
FIG. 3 depicts a main amplifier circuit coupled with two auxiliary circuits that may adjust a peak frequency to reduce jitter.

To illustrate how an active load may be adjusted for a peak frequency and reduce jitter produced by an amplifier, we move now to FIG. 3. FIG. 3 depicts one embodiment of a circuit 300 having a first auxiliary circuit 302, a second auxiliary circuit 330, and a main amplifier circuit 350, wherein auxiliary circuits 302 and 330 as well as amplifier circuit 350 comprise arrangements of n-type and p-type metal oxide semi-conductor transistors (n-MOS and p-MOS transistors). As shown in FIG. 3, main amplifier circuit 350 may comprise a differential amplifier having a first input 358 and a second input 364. Main amplifier circuit 350 may, for example, correspond to amplifier 230 in FIG. 2. Similarly, p-MOS transistors 352 and 354 may correspond to active load 220, while the remainder of circuit 300 may correspond to frequency gain booster 210 in FIG. 2.

An external circuit coupled to circuit 300 may transmit a high frequency cyclic signal containing jitter to inputs 358 and 364. For example, circuit 300 may comprise a forwarding clock amplifier in a FB-DIMM I/O or other high-speed I/O circuit. The external circuit may transmit the forwarded clock signal to main amplifier circuit 350 by sending input 358 high and input 364 low during a low-to-high transition of the clock signal, while sending input 358 low and input 364 high during a high-to-low clock signal transition.

Upon receiving the high frequency signal at inputs 358 and 364, main amplifier circuit 350 may generate a corresponding amplified output signal at outputs 362 and 356. Since the high frequency signal may contain jitter, main amplifier circuit 350 may increase the jitter in addition to amplifying the high frequency input signal amplitude. To reduce the amount of jitter present in the output signal at outputs 362 and 356, a circuit designer may adjust a bias current using variable current source 308. By adjusting variable current source 308, first auxiliary circuit 302 and second auxiliary circuit 330 may adjust the peak frequency response of main amplifier circuit 350. Current source 308 may change the gate voltage of n-MOS transistor 314, which will in turn affect the operation of n-MOS transistor 310. More specifically, as the gate voltage of n-MOS transistor 314 changes, the voltage potential at the source terminal of n-MOS transistor 310 will also change depending on how n-MOS transistor 314 couples the source terminal of n-MOS transistor 310 with ground, or Vss. To better understand how variable current source 308 may adjust the peak frequency response, as well as understand how auxiliary circuits 302 and 330 may adjust the peak frequency response of main amplifier circuit 350 and reduce jitter, one may need to understand the general operation of circuit 300.

Applying a signal, such as a forwarded clock signal, to main amplifier circuit 350 will send inputs 358 and 364 high and low in an alternating fashion. In other words, input 358 will go high and input 364 will go low for one transition of the input signal, while input 358 will go low and input 364 will go high for the corresponding transition in the reverse direction. These complementary input signal transitions may correspond to low-to-high and high-to-low transitions of a forwarded clock signal.

Sending input 358 low will pinch off the flow of current through n-MOS transistor 366. As the flow of current through n-MOS transistor 366 decreases, the voltage at the node for output 356 will tend to increase. Similarly, sending input 364 high will turn on n-MOS transistor 368. As the flow of current through n-MOS transistor 368 increases, the voltage at the node for output 362 will tend to decrease. Stated differently, changing the logical state of inputs 358 and 364 generates complementary logical states at outputs 356 and 362, respectively. The frequency response of a signal at output 356 may be altered by the operation of auxiliary circuit 302 while the frequency response of a signal at output 362 may be altered by the operation of auxiliary circuit 330.

When the voltage of output 356 increases, a positively increasing bias voltage will be applied to the gate of n-MOS transistor 310 via interconnect line 348. As the gate voltage of n-MOS transistor 310 increases, current flow will increase between its source and drain terminals tending to decrease the voltage at the gates of p-MOS transistors 304 and 306. As the bias voltage at the gate of p-MOS transistor 306 decreases, it will increase the voltage at the gate and drain of n-MOS 312 which is also connected to the gate of p-MOS transistor 352. Therefore, the voltage at the gate of p-MOS 352 will tend to follow the voltage at output 356, which is also connected to the source terminal of p-MOS 352. The resulting effect may cause p-MOS 352 to act as an active load with equivalent impedance equal to the inverse of the trans-conductance of p-MOS 352. Stated differently and summarily, swinging input 358 low will cause output 356 to swing high. However, the response rate and resulting voltage level of output 356 may be dictated by the operation of auxiliary circuit 302.

As noted above when interconnect line 348 transitions high and increases the gate voltage for n-MOS transistor 310, the gate voltage for p-MOS transistor 306 will decrease and start pinching off p-MOS transistor 352. This may be true for DC and low speed signals. As the signal speed increases, the delay from the voltage change in output 356 to the voltage change at the gate of p-MOS 352 generally becomes important. Furthermore, voltage change at the gate of p-MOS 352 may return to output 356 through p-MOS transistor 352 itself, thus forming a loop. The effect of delays and the loop may therefore be frequency dependent. One may observe that at a certain frequency the delay through the loop may match the time cycle of the signaling, and the return signal, can augment the original signal. This may have the effect of a resonance that increases the signal gain near a particular frequency. In other words, a peak in frequency response may be created.

A similar analysis for a low-to-high signal applied to input 358 will reveal that the auxiliary circuit 302 will tend to affect the response of output 356 transitioning to a low state in response to the corresponding high-to-low auxiliary signal of interconnect line 348. Likewise, a detailed analysis of the operation of auxiliary circuit 330 will reveal that it will tend to affect the response at output 362 in response to transitions of input 364. In view of these analyses, one may see that the two auxiliary circuits 302 and 330 may be used to receive auxiliary signals from main amplifier circuit 350 via interconnect lines such as interconnect line 348, generate control or feedback signals based upon the auxiliary signals, and feed those control or feedback signals back to the gates of the p-MOS loads, p-MOS transistors 352 and 354.

The result of the feedback and control of the p-MOS loads may produce a frequency response similar to that of an LC resonant amplifier. Since the delay of the feedback loop depends on the amount of current flow, and the resonant frequency depends on the delay of the loop as illustrated in the foregoing discussion, one can see that the peak frequency may be controlled by tuning the bias current of variable current source 308. Circuit 300 may, therefore, create a band pass response with the center peak frequency corresponding to the input signal frequency. In so doing, circuit 300 may provide signal amplification needed for the input signal, such as a forwarded clock signal, yet at the same time reduce the jitter amplification. For illustration, a 4 GHz forwarded clock signal may be applied to input 358. Based on this input signal, main amplifier circuit 350 may produce a corresponding 4 GHz output signal at output 356. Auxiliary circuit 302 may, however, attenuate the high frequency jitter components above and below the center or peak 4 GHz frequency. In other words, auxiliary circuit 302 may tend to amplify or pass frequencies near the center frequency of 4 GHz, yet attenuate frequencies outside a band of frequencies, say 1 GHz for example, centered around 4 GHz. Stated differently, auxiliary circuit 302 may pass frequencies around 4 GHz but attenuate frequencies outside the limits of the 1 GHz band, those frequencies below 3.5 GHz and above 4.5 GHz. The exact frequency response of circuit 300 may be relatively sharp in some embodiments, while rather flat in other embodiments. In other words, different embodiments will provide different frequency response qualities. Additionally, the width of the band will vary from embodiment to embodiment. For example, the band may be 500 MHz in one embodiment but be 2 GHz in another.

Circuit 300 may comprise one embodiment of a reduced jitter amplifier. Other variations may essentially perform the same jitter amplification reduction yet have fewer or more components. For example, an alternative embodiment of FIG. 3 may include high pass filter (HPF) AC coupling capacitors at inputs 358 and 364, depending on the input signal. The combination of main amplifier 350 and auxiliary circuits 302 and 330 may create a proper output common mode. Because of this, HPF AC coupling may often not be needed at an output of a clock equalizer in order to connect to subsequent circuits. This could provide an advantage over an LC-type clock equalizer, since the output common mode of an LC-type clock equalizer may be Vcc, which may be unsuitable for many circuits, and therefore a HPF may be necessary to shift the common mode to the desired voltage level.

In another embodiment, circuit 300 may contain additional stages. Additional stages may be necessary, for example, to create a higher gain and peak response, as well as better band pass cut-off response. In an even further example, circuit 300 may not include such elements as tail current n-MOS transistor 370. In the embodiment of circuit 300 shown in FIG. 3, n-MOS transistor 370 may be used to control how much current flows through the amplifier. Such control may be necessary depending on the circuits coupled to outputs 356 and 362. Alternative embodiments may not need such a tail current transistor. Also, in the embodiment shown in FIG. 3, current source 308 has the appearance of being part of auxiliary circuit 302. However, closer inspection reveals that current source 308 affects the operation of both auxiliary circuit 302 and 330. Therefore, one should note that alternative embodiments may have current source 308 located in various places. Additionally, even further embodiments may not specifically have such a variable current source at all. Such embodiments may used fixed components, such as resistors, to create bias voltages which affect the peak frequency response of circuit 300.

Figure 4:
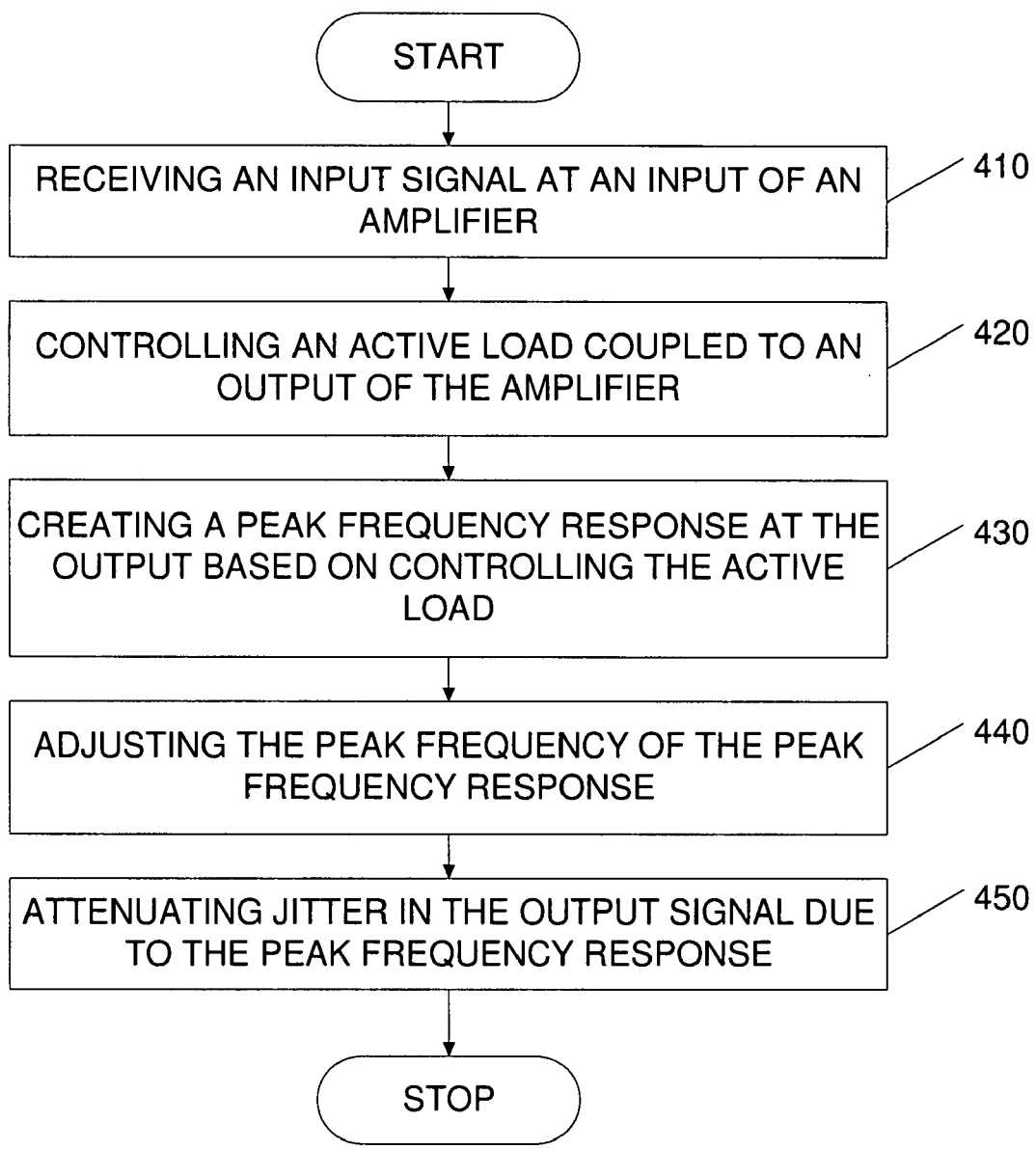
FIG. 4 illustrates a method for adjusting a peak frequency to reduce jitter.

FIG. 4 depicts a flowchart 400 illustrating an embodiment of a method for attenuating jitter. Flowchart 400 begins with receiving an input signal at an input of an amplifier (element 410). For example, the input signal may comprise a forwarded clock signal or even a data signal as part of a continuous time linear equalizer (CTLE). Upon receiving the input signal at the amplifier input (element 410), an embodiment according to flowchart 400 may continue by controlling an active load coupled to an output of the amplifier (element 420). For example, an auxiliary signal corresponding to the input signal may be fed to a control network that manipulates the active load in response to the input signal. The active load may comprise an n-MOS or a p-MOS transistor or other single circuit device, or a more complex circuit containing many circuit elements, such as transistors, capacitors, buffers, etc.

As the active load is being controlled in response to the input signal (element 420), the method embodiment of flowchart 400 may continue by creating a peak frequency response at the output, based on controlling the active load (element 430). While creating the peak frequency response at the output, a method implemented according to flowchart 400 may adjust the peak frequency of the peak frequency response (element 440). For example, if the input frequency is 6 GHz and the amplifier peak frequency is 5.2 GHz, the peak frequency may be adjusted, or shifted, from 5.2 GHz to 6 GHz, to match the frequency of the input signal. Once the frequency has been adjusted (element 440), the resulting output signal may attenuate the effects of high frequency jitter present in the input signal, such that the overall amplified jitter at the output will be attenuated (element 450). Stated differently, as the peak frequency response of the amplifier is adjusted to match the frequency of the input signal, jitter present in the input signal which is present away from the center or peak frequency may be attenuated. For example, for an input signal frequency of 6 GHz, a peak frequency response set at a matching 6 GHz will tend to pass and amplify the input signal yet attenuate jitter signal components which may be present at 5 GHz and 7 GHz.

It will be apparent to those skilled in the art having the benefit of this disclosure that the embodiments herein contemplate apparatuses, circuits, and methods to amplify signals with reduced jitter. It is understood that the form of the embodiments shown and described in the detailed description and the drawings are to be taken merely as examples. It is intended that the following claims be interpreted broadly to embrace all the variations of the embodiments disclosed.

Although some aspects have been described in detail for some embodiments, it should be understood that various changes, substitutions and alterations can be made herein without departing from the spirit and scope of the embodiments as defined by the appended claims. Although one embodiment may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed that perform substantially the same function or achieve substantially the same result as the corresponding embodiments described herein may be utilized according to the embodiments herein. Accordingly, the appended claims are intended to include within their scope such processes, machines, manufacture, compositions of matter, means, methods, or steps.

What is claimed is:

1. An apparatus, comprising:
an amplifier circuit to generate an output signal based on an input signal, wherein the input signal has an input frequency;
an active load coupled to the amplifier circuit, the active load to affect generation of the output signal based upon a control signal, wherein a first transistor is arranged to control the active load via a second transistor, wherein further the drain terminal of the first transistor is coupled to the gate of the second transistor; and
an auxiliary circuit coupled to the amplifier circuit via an interconnect line, the auxiliary circuit to generate the control signal based on an auxiliary signal of the interconnect line, wherein the auxiliary circuit is arranged to resonate the active load to create a peak frequency response of the output signal for a band of frequencies centered around the input frequency and attenuate the output signal for frequencies outside the band.

2. The apparatus of claim 1, further comprising a variable current source coupled to the auxiliary circuit to adjust the peak frequency response, wherein the auxiliary circuit is arranged to adjust the peak frequency of the peak frequency response in response to a change of current of the variable current source.

3. The apparatus of claim 1, wherein a current source is connected to the gate of a first transistor, wherein further the drain terminal of the first transistor is coupled to the source terminal of a second transistor, wherein further the peak frequency of the peak frequency response is based on the current of the current source.

4. The apparatus of claim 1, further comprising a third transistor to affect the operation of the first transistor, wherein the third transistor couples the source terminal of the first transistor to Vss.

5. The apparatus of claim 1, wherein the auxiliary circuit consists essentially of MOS transistors, wherein further the auxiliary circuit is configured to cause the active load to have an impedance equal to the inverse of the trans-conductance of the active load.

6. The apparatus of claim 1, wherein the auxiliary circuit consists essentially of four p-MOS transistors and seven n-MOS transistors.

7. The apparatus of claim 1, further comprising a tail current transistor coupled to the amplifier circuit to limit current to a load coupled to the amplifier.

8. The apparatus of claim 1, further comprising a high speed input-output interface coupled to the amplifier.

9. The apparatus of claim 8, wherein the high speed input-output interface comprises a Dual In-line Memory Module interface.

10. An apparatus, comprising:

an amplifier comprising an input transistor with a source terminal coupled to Vss and a drain terminal coupled to an output terminal;

an active load coupled to the amplifier to affect generation of an output signal; and a frequency gain booster coupled to the active load, the frequency gain booster comprising:

a first transistor with a first terminal coupled to the active load, an interconnect line coupling the amplifier to a first gate of the first transistor, wherein the first transistor is arranged to resonate the active load and create a peak frequency response of the output signal based on an auxiliary signal of the interconnect line, the peak frequency response to pass a band of frequencies centered around an input frequency of an input signal of the input transistor and attenuate frequencies outside the band, wherein the frequency gain booster consists essentially of four p-MOS transistors and seven n-MOS transistors.

11. The apparatus of claim 10, further comprising a current source coupled to the frequency gain booster to adjust the peak frequency response, wherein the current source is arranged to tune the peak frequency of the peak frequency response.

12. The apparatus of claim 10, wherein the amplifier comprises a differential amplifier, wherein further the frequency gain booster is arranged to boost the high frequency gain of the differential amplifier to create the peak frequency response.

13. The apparatus of claim 10, wherein the active load comprises at least one MOS transistor.

14. The apparatus of claim 10, wherein the frequency gain booster consists essentially of n-MOS and p-MOS transistors.

* * * * *